(12) United States Patent  
Droopad et al.

(10) Patent No.: US 7,799,647 B2
(45) Date of Patent: Sep. 21, 2010

(54) MOSFET DEVICE FEATURING A SUPERLATTICE BARRIER LAYER AND METHOD

(75) Inventors: Ravindranath Droopad, Chandler, AZ (US); Matthias Passlack, Chandler, AZ (US); Karthik Rajagopalan, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 475 days.

(21) Appl. No.: 11/831,394

(22) Filed: Jul. 31, 2007

(65) Prior Publication Data  
US 2009/0032802 A1 Feb. 5, 2009

(51) Int. Cl.  
H01L 21/336 (2006.01)  
H01L 31/00 (2006.01)

(52) U.S. Cl. .................. 438/285; 257/20; 257/E29.078

(58) Field of Classification Search .................. 438/285; 257/20, E29.078  
See application file for complete search history.

(56) References Cited

U.S. PATENT DOCUMENTS

| | | | | |
|---|---|---|---|---|
| 5,107,314 A | * | 4/1992 | Kahng et al. ................. | 257/410 |
| 5,206,528 A | * | 4/1993 | Nashimoto ................... | 257/192 |
| 6,034,386 A | * | 3/2000 | Ando .......................... | 257/280 |
| 6,429,467 B1 | * | 8/2002 | Ando .......................... | 257/194 |
| 6,528,405 B1 | * | 3/2003 | Martinez et al. ............. | 438/602 |
| 6,878,576 B1 | * | 4/2005 | Mears et al. ................. | 438/162 |
| 6,963,090 B2 | | 11/2005 | Passlack et al. | |
| 2003/0137018 A1 | * | 7/2003 | Passlack et al. ............. | 257/410 |

OTHER PUBLICATIONS

Rajagopalan, K. et al.; "Enhancement-Mode GaAs n-Channel MOSFET"; IEEE Electron Device Letters; Dec. 2006; pp. 959-962; vol. 27, No. 12; IEEE.

Passlack, M. et al.; "High Mobility NMOSFET Structure With High-k Dielectric"; IEEE Electron Device Letter; Oct. 2006; pp. 713-715; vol. 26, No. 10; IEEE.

* cited by examiner

*Primary Examiner*—Hsien-ming Lee  
*Assistant Examiner*—Kevin Parendo  
(74) *Attorney, Agent, or Firm*—Michael Balconi-Lamica

(57) ABSTRACT

A method of forming a semiconductor structure includes forming a channel layer; forming a superlattice barrier layer overlying the channel layer, and forming a gate dielectric overlying the superlattice barrier layer. The superlattice barrier layer includes alternating first and second layers of barrier material. In addition, the superlattice barrier layer is configured for increasing a transconductance of the semiconductor device by at least a factor of three over a semiconductor device absent such superlattice barrier layer.

8 Claims, 3 Drawing Sheets

US 7,799,647 B2

MOSFET DEVICE FEATURING A SUPERLATTICE BARRIER LAYER AND METHOD

BACKGROUND

1. Field

This disclosure relates generally to semiconductor devices, and more specifically, to MOSFET devices featuring a superlattice barrier layer and method of making the same.

2. Related Art

Prior art compound semiconductor MOSFET devices suffer in terms of performance limitations, wherein transconductance values only reached a third (⅓) of expected numbers. In addition, known compound semiconductor MOSFET devices use a homogeneous barrier layer. It would be desirable to overcome such a performance limitation of compound semiconductor MOSFET devices.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
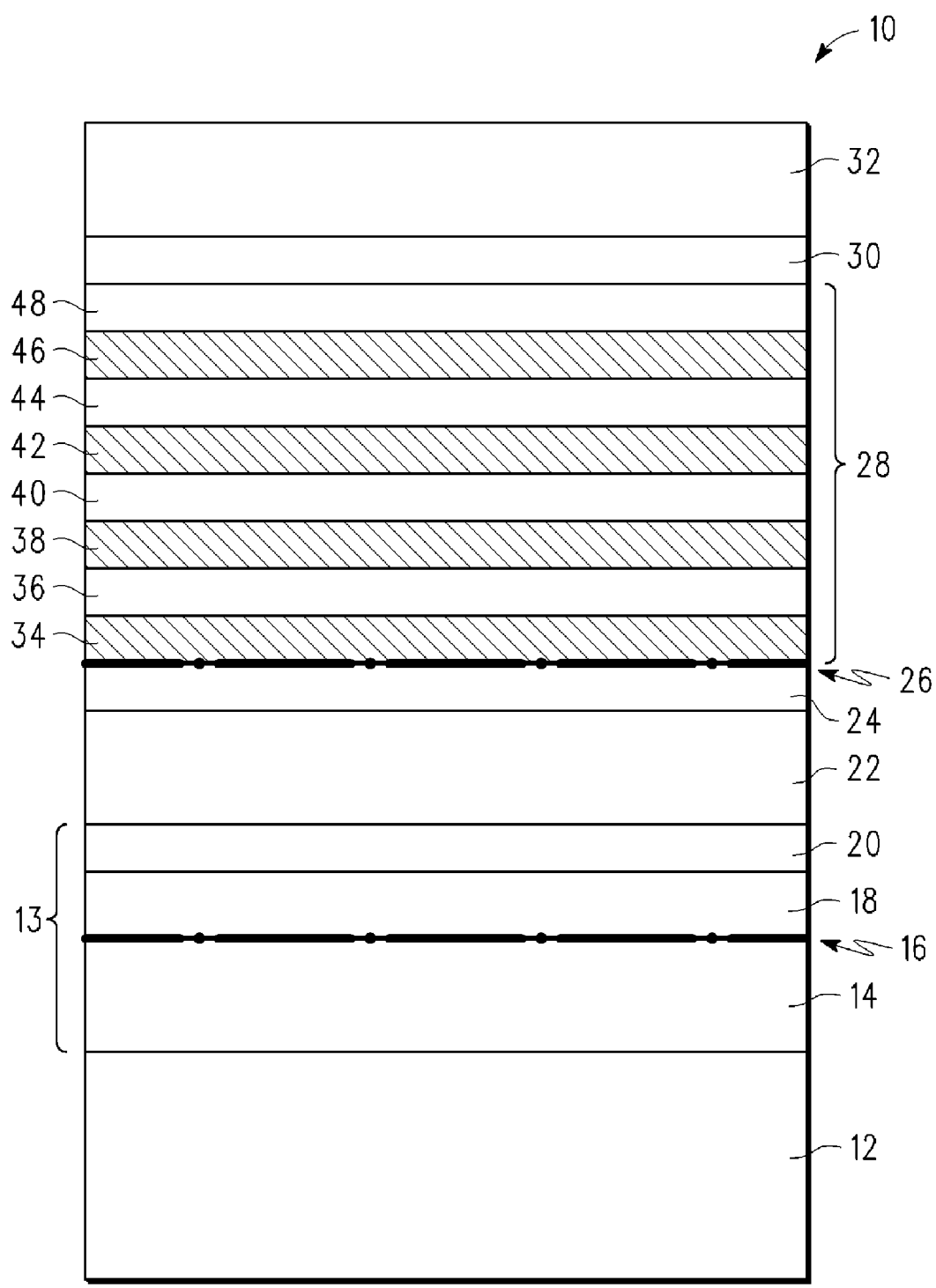
FIG. 1 is a schematic view, in cross section, of an enhancement mode compound semiconductor structure in accordance with one exemplary embodiment of the present disclosure.

FIG. 1 illustrates schematically, in cross section, an enhancement mode compound semiconductor structure 10, in accordance with one exemplary embodiment of the present disclosure. Semiconductor structure 10 includes a buffer layer 12 overlying a substrate (not shown), wherein the substrate comprises any suitable semiconductor material. For example, the substrate can include a high quality monocrystalline gallium arsenide (GaAs) substrate as available in the semiconductor industry. In one embodiment, structure 10 includes a III-V compound semiconductor structure. In another embodiment, structure 10 includes a compound semiconductor structure other than a III-V compound semiconductor structure, according to the requirements of a given semiconductor device implementation or application.

A bottom spacer layer structure 13 overlies buffer layer 12. Bottom spacer layer structure 13 comprises a first III-V material spacer layer 14, a second III-V material spacer layer 18, and a third III-V material spacer layer 20. Disposed in-between the first and second spacer layers 14 and 18 is a delta-doping 16. In one embodiment, the first III-V material spacer layer 14 comprises aluminum gallium arsenide (AlGaAs), having a thickness on the order of 10-1000 nanometers. The second III-V material spacer layer 18 comprises AlGaAs, having a thickness on the order of 0.5-10 nanometers. The third III-V material spacer layer 20 comprises GaAs, having a thickness on the order of 0-20 angstroms (0-20 Å). The delta-doping 16 comprises a plane of silicon atoms.

Semiconductor structure 10 further includes a channel layer 22 and a top spacer layer 24. In one embodiment, the channel layer 22 comprises indium gallium arsenide (InGaAs), having a thickness on the order of 100 angstroms (100 Å). Top spacer layer 24 comprises GaAs, having a thickness on the order of 20 angstroms (20 Å).

Buffer layer 12, channel layer 22 and spacer layers (14, 18, 20, and 24) each may be formed of any suitable III-V material, although preferably buffer layer 12, channel layer 22, spacer layers (14, 18) and spacer layers (20, 24) are each formed of a different III-V material. In one embodiment of the present disclosure, buffer layer 12 is formed of gallium arsenide (GaAs), channel layer 22 comprises indium gallium arsenide (InGaAs), spacer layers (14, 18) comprise aluminum gallium arsenide (AlGaAs) and spacer layers (20,24) comprise gallium arsenide (GaAs). It will be appreciated that, while buffer layer 12 is illustrated in FIG. 1 as a layer separate from an underlying substrate (not shown), buffer layer 12 and the underlying substrate may form one continuous layer depending on the materials from which these layers are formed.

Semiconductor structure 10 also comprises at least one doped layer, such as doped layer 16 or doped layer 26 illustrated in FIG. 1. While semiconductor structure 10 is illustrated in FIG. 1 as having two doped layers, it will be appreciated that structure 10 may have one, two or more doped layers. Doped layers (16,26) may be positioned above, below and/or within channel layer 22. Doped layers (16,26), and any additional doped layers, may comprise any suitable doping component known in the semiconductor industry, such as, for example, silicon (Si) (n-channel devices) and beryllium (Be) or carbon (C) (p-channel devices). The doped layers of structure 10 may be selected, that is, the doping levels of doped layers (16,26) may be selected, such that, for a particular MOSFET configuration, enhancement mode operation is achieved.

Referring still to FIG. 1, structure 10 further includes a superlattice barrier layer structure 28. The superlattice barrier layer structure 28 comprises a plurality of alternating first and second layers of III-V compound semiconductor barrier material. In one embodiment, the superlattice barrier layer structure is formed of a periodic superlattice barrier of alternating layers of aluminum arsenide (AlAs) and gallium arsenide (GaAs). In one example, the periodic superlattice barrier layer comprises four sets of alternating layers of AlAs and GaAs, wherein each layer of AlAs has a thickness on the order of 0.8 mono-layer (ML) and each layer of GaAs has a thickness on the order of 1.0 mono-layer (ML). In addition, the superlattice barrier layer is configured for increasing a transconductance of a semiconductor device formed with the semiconductor structure by at least a factor of three over a semiconductor device absent such superlattice barrier layer.

According to one embodiment of the present disclosure, a top AlGaAs barrier layer of prior known MOSFET devices has been replaced by a superlattice of an approximate identical average composition, which has been found by the inventors to reduce the oxide/GaAs interface state density which could affect GaAs MOSFET operation. As known in the art, an AlGaAs barrier layer is used in MOSFET structures below the high-K oxide layer to screen oxide/GaAs interface states and to alleviate charge injection into the oxide. Previously, a forty-five percent aluminum (45% Al) composition had been used for the top barrier layer. The 45% Al composition of the prior known AlGaAs barrier layer film was constant, i.e. homogeneous.

According to the embodiments of the present disclosure, replacing the prior known barrier layer with a superlattice barrier layer structure having an average composition of 45% is accomplished by depositing alternating layers of AlAs and GaAs with the ratio of thickness of the superlattice barrier layer structure adjusted for the required composition. In other words, the ratio of thickness is selected to approximate the Al composition of the homogeneous AlGaAs barrier layer. For example, a 0.8 mL AlAs/1 mL GaAs would result in an average composition of just under 45%. The thickness of the superlattice barrier layer structure can be set by the number of periods deposited. In one example, using four (4) periods of 0.8 mL AlAs/1 mL GaAs layers, the thickness of the superlattice barrier layer structure is on the order of approximately 20 Å.

In addition to the superlattice barrier layer 28, structure 10 further includes a surface termination layer 30 and a gate oxide layer 32 that overlie the superlattice barrier layer structure 28. Surface termination layer 30 comprises any suitable semiconductor top surface layer, for example, to enable growth of subsequent layers over Al containing compounds. In one embodiment, surface termination layer 30 comprises one to two mono-layers (1-2 ML) of GaAs. In addition, gate oxide layer 32 comprises any suitable gate oxide material. In one embodiment, gate oxide layer 32 comprises gallium oxide ($Ga_2O_3$). In another embodiment, gate oxide layer 32 comprises ($Gd_xGa_{1-x}$)$_2O_3$ (GGO).

Figure 2:
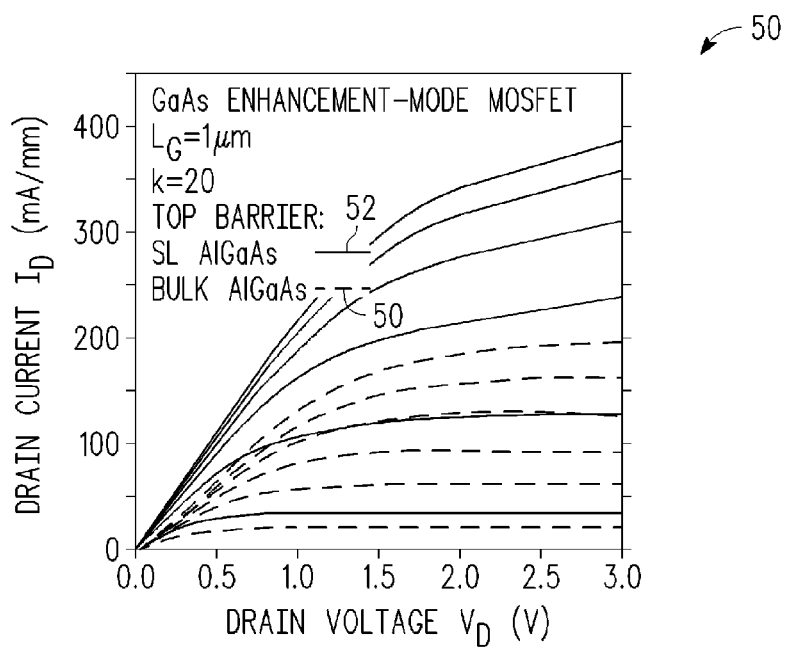
FIG. 2 is a graphical representation view of drain current ($I_D$) versus drain voltage ($V_D$) curves for a MOSFET device having a superlattice (SL) barrier layer structure according to the embodiments of the present disclosure and for a MOSFET device having a bulk barrier layer.
Figure 3:
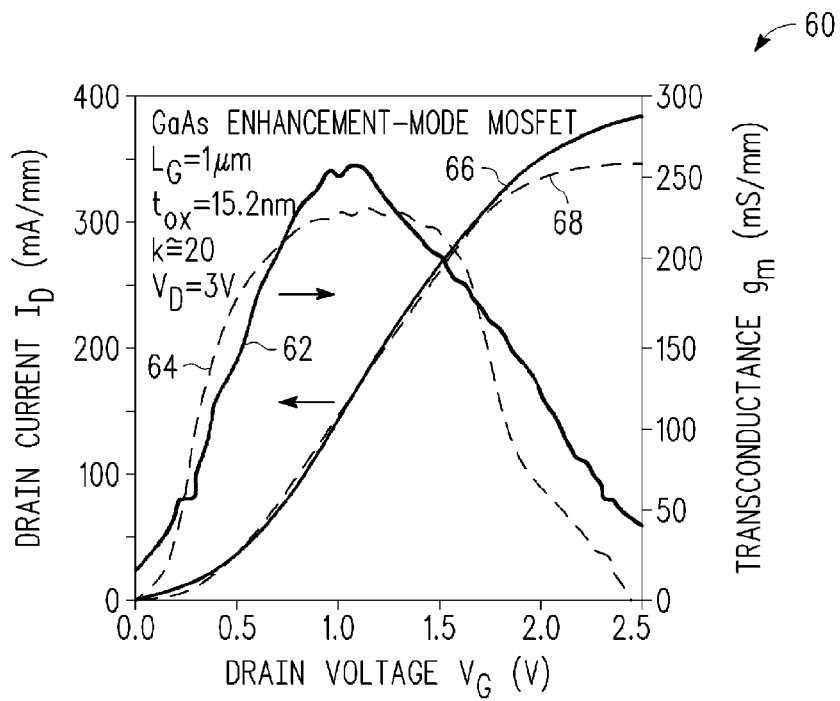
FIG. 3 is a graphical representation view of drain current ($I_D$) and transconductance ($g_m$) versus gate voltage ($V_G$) curves for a MOSFET device having a superlattice (SL) barrier layer structure according to the embodiments of the present disclosure comparing measured and simulated data.

The use of the superlattice (SL) barrier layer substantially enhances the MOSFET device performance as shown by the content 50 and 60 of FIGS. 2 and 3, respectively. In FIG. 2, drain current ($I_D$) versus drain voltage ($V_D$) curves for a MOSFET device having a superlattice (SL) barrier layer structure (solid lines indicated by reference numeral 52) and for a MOSFET device having a bulk barrier layer (dashed lines indicated by reference numeral 54) are shown. In particular, the top curve for each device is for $V_G$=3 V, the $V_G$ step is −0.5 V from top.

In FIG. 3, drain current ($I_D$) and transconductance ($g_m$) versus gate voltage ($V_G$) curves for a MOSFET device having a superlattice (SL) barrier layer structure according to the embodiments of the present disclosure comparing measured and simulated data are shown. The measured data is represented by the solid lines indicated by reference numerals 62 and 66. The simulated data is represented by the dashed lines indicated by reference numerals 64 and 68. The agreement between measured and simulated data in FIG. 3 shows that MOSFETs with the SL barrier layer structure according to the embodiments of the present disclosure reach expected performance, i.e. the intrinsic device is not substantially affected by interface traps. In addition, for MOSFETs with a SL barrier layer structure according to the embodiments of the present disclosure, transconductance $g_m$ and maximum drain current increase by a factor of two (2×) and three (3×), respectively.

Figure 4:
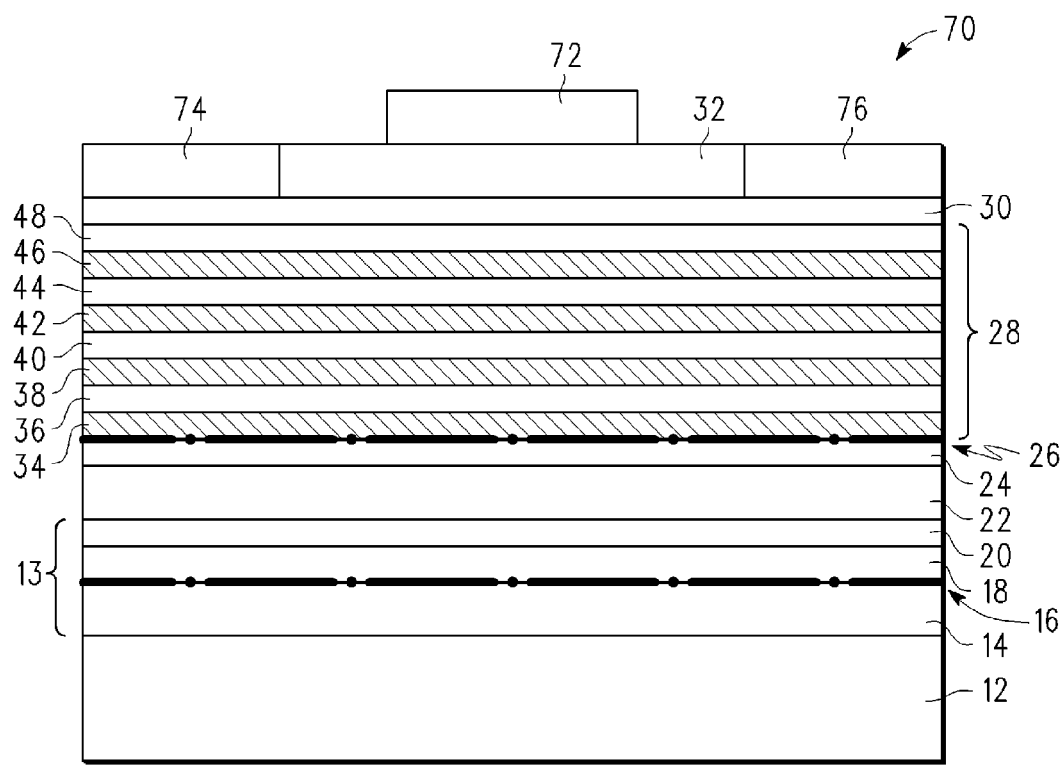
FIG. 4 is a schematic view, in cross section, of an enhancement mode compound semiconductor device in accordance with one exemplary embodiment of the present disclosure.

FIG. 4 illustrates schematically, in cross section, an enhancement mode compound semiconductor MOSFET device 70 in accordance with one exemplary embodiment of the present invention. Device 70 includes the semiconductor structure 10 as discussed herein with respect to FIG. 1. Device 70 further includes a metal gate electrode 72 and source and drain ohmic contacts (74,76). In particular, metal gate electrode 72 comprises a metal gate electrode that is stable in the presence of the gate dielectric material (or gate oxide material) and overlies gate dielectric layer 32. The material for metal gate electrode 72 comprises any suitable material selected for providing a given work function such that for a particular MOSFET configuration enhancement mode operation is achieved.

Source and drain ohmic contacts 74, 76 are formed overlying superlattice barrier layer structure 28 and are separated from metal gate electrode 72 by source and drain access regions. Source and drain access regions comprise those areas of structure 10 laterally disposed between the source ohmic contact 74 and metal gate electrode 72 and between drain ohmic contact 76 and metal gate electrode 72, respectively. Source and drain ohmic contacts 74, 76 may be formed of any suitable electrically conductive material as is known in the semiconductor industry.

Enhancement mode operation of device 70 may be realized based on a relationship between the work function of metal gate electrode 72 and the dopant level of doped layers (16,26). While the doped layers (16,26) of structure 10 serve as a source for free carriers, thus eliminating the need for ion-implanted source and drain extensions within structure 10, without a suitable metal gate electrode, doped layers (16,26) may adversely shift the threshold voltage of device 70 preventing enhancement mode operation.

By now it should be appreciated that there has been provided a method of forming a compound semiconductor structure comprising: forming a compound semiconductor channel layer; forming a superlattice barrier layer overlying the channel layer, the superlattice barrier layer including a plurality of alternating first and second layers of compound semiconductor barrier material; and forming a gate oxide overlying the superlattice barrier layer. Forming the superlattice barrier layer can comprise forming a periodic superlattice barrier of alternating layers of aluminum arsenide (AlAs) and gallium arsenide (GaAs), wherein the periodic superlattice barrier layer further comprises four sets of alternating layers of AlAs and GaAs. In one embodiment, each layer of AlAs has a thickness on the order of 0.8 mono-layer (ML) and each layer of GaAs has a thickness on the order of 1.0 mono-layer (ML).

In another embodiment, the superlattice barrier layer is configured for increasing a transconductance of a semiconductor device formed with the semiconductor structure by at least a factor of three over a semiconductor device absent such superlattice barrier layer. In a further embodiment, the channel layer comprises indium gallium arsenide (InGaAs), and the gate oxide comprises an oxide selected from gadolinium gallium oxide ($Gd_xGa_{1-x}$)$_2O_3$ and $Ga_2O_3$.

In still another embodiment, the method further comprises: prior to forming the channel layer, forming a III-V compound semiconductor buffer layer and forming a bottom spacer layer structure overlying the buffer layer; and subsequent to forming the channel layer, forming a top spacer layer overlying the channel layer; and forming at least one doped layer, wherein the at least one doped layer comprises at least one selected from the group consisting of (i) a delta-doping disposed within the bottom spacer layer structure, (ii) a delta-doping disposed within the channel layer, and (iii) a delta-doping disposed on the top spacer layer.

In another embodiment, a method of forming a semiconductor structure comprises: forming a channel layer, wherein the channel layer comprises InGaAs; forming a superlattice AlGaAs barrier layer overlying the channel layer, the superlattice barrier layer including a plurality of alternating first and second layers of III-V compound semiconductor barrier material, wherein forming the superlattice barrier layer comprises forming a periodic superlattice barrier of alternating layers of AlAs and GaAs; and forming a gate dielectric overlying the superlattice barrier layer, wherein the gate dielectric comprises one selected from $(Gd_xGa_{1-x})_2O_3$ and $Ga_2O_3$. The periodic barrier layer can comprise four sets of layers of AlAs and GaAs. Furthermore, each layer of AlAs can have a thickness on the order of 0.8 mono-layer (ML) and each layer of GaAs can have a thickness on the order of 1.0 mono-layer (ML).

According to one embodiment, an enhancement mode metal-oxide semiconductor field effect transistor (EMOSFET) comprises: a III-V compound semiconductor buffer layer overlying a III-V compound semiconductor substrate; a bottom spacer layer structure overlying the buffer layer; a channel layer overlying the bottom spacer layer structure; a top spacer layer overlying the channel layer; at least one doped layer, wherein the at least one doped layer comprises at least one selected from the group consisting of (i) a delta-doping disposed within the bottom spacer layer structure, (ii) a delta-doping disposed within the channel layer, and (iii) a delta-doping disposed on the top spacer layer; a superlattice barrier layer structure, wherein the superlattice barrier layer structure includes a plurality of alternating layers of first and second barrier materials; a gate oxide layer overlying the superlattice barrier layer structure; a metal gate electrode overlying the gate oxide layer; and source and drain ohmic contacts laterally disposed from the gate electrode and overlying the superlattice barrier layer structure. In one embodiment, the at least one doped layer comprises a delta-doping disposed within the bottom spacer layer structure and a delta-doping disposed on the top spacer layer.

In another embodiment, the superlattice barrier layer structure comprises a periodic superlattice barrier of alternating layers of aluminum arsenide (AlAs) and gallium arsenide (GaAs). The periodic superlattice barrier layer further comprises four sets of alternating layers of AlAs and GaAs. Furthermore, in another embodiment, each layer of AlAs has a thickness on the order of 0.8 mono-layer (ML) and each layer of GaAs has a thickness on the order of 1.0 mono-layer (ML). The superlattice barrier layer is configured to increase a transconductance of the device by at least a factor of three over a semiconductor device absent such superlattice barrier layer.

The embodiments of the present disclosure provide a number of advantages. Use of the superlattice as barrier layer between channel layer and gate oxide advantageously improves MOSFET device performance to an expected level. Advantages of the superlattice barrier layer structure are applicable to high performance RF applications, e.g. higher $I_{max}$, smaller die size, more flexible circuit designs, better linearity, lower noise, and higher integration levels. The embodiments of the present disclosure also enable a combination of MOS advantages (e.g., ruggedness, scalability, integration) with advantages of III-V semiconductor devices (e.g., higher efficiency, better frequency performance). Furthermore, advantages of the superlattice barrier layer structure are also applicable to digital applications, for example, to enable introduction of the successful Si MOS concept of 2-d scaling into the III-V compound semiconductor world.

The embodiments of the present disclosure can be fabricated using suitable known growth techniques, such as molecular beam epitaxy (MBE) or metal oxide chemical vapor deposition (MOCVD).

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the method can be applied to RF and mixed signal semiconductor circuits, e.g., in mobile products such as handsets or in WLAN. Digital, hetero-integration and other semiconductor device applications are also possible. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a compound semiconductor structure comprising:
   forming a compound semiconductor channel layer;
   forming a superlattice barrier layer overlying the compound semiconductor channel layer, the superlattice barrier layer including four sets of alternating first and second layers of AlAs and GaAs, wherein each layer of AlAs has a thickness of substantially 0.8 mono-layer (ML) and each layer of GaAs has a thickness of substantially 1.0 mono-layer (ML); and
   forming a gate oxide overlying the superlattice barrier layer.

2. The method of claim 1, further comprising forming a metal gate electrode overlying the gate oxide.

3. The method of claim 1, wherein the compound semiconductor channel layer comprises indium gallium arsenide (InGaAs), and wherein the gate oxide comprises an oxide selected from gadolinium gallium oxide and gallium oxide.

4. The method of claim 1, further comprising:
   prior to forming the compound semiconductor channel layer, forming a compound semiconductor buffer layer and forming a bottom spacer layer structure overlying the compound semiconductor buffer layer; and
   subsequent to forming the compound semiconductor channel layer, forming a top spacer layer overlying the compound semiconductor channel layer; and
   forming at least one doped layer, wherein the at least one doped layer comprises at least one selected from the group consisting of (i) a delta-doping disposed within the bottom spacer layer structure, (ii) a delta-doping disposed within the compound semiconductor channel layer, and (iii) a delta-doping disposed on the top spacer layer.

5. A method of forming a semiconductor structure comprising:
forming a channel layer, wherein the channel layer comprises InGaAs;
forming a superlattice AlGaAs barrier layer overlying the channel layer, the superlattice AlGaAs barrier layer including a plurality of alternating first and second layers of compound semiconductor barrier material, wherein forming the superlattice AlGaAs barrier layer comprises forming a periodic superlattice barrier of alternating layers of AlAs and GaAs, wherein each layer of AlAs has a thickness of substantially 0.8 mono-layer (ML) and each layer of GaAs has a thickness of substantially 1.0 mono-layer (ML); and
forming a gate dielectric overlying the superlattice barrier layer, wherein the gate dielectric comprises one selected from gadolinium gallium oxide and gallium oxide.

6. The method of claim 5, wherein the periodic superlattice barrier further comprises four sets of layers of AlAs and GaAs.

7. A compound semiconductor structure formed by the method of claim 1.

8. A compound semiconductor structure formed by the method of claim 5.

* * * * *